US009039863B2

(12) United States Patent
Matsumoto et al.

(10) Patent No.: US 9,039,863 B2
(45) Date of Patent: May 26, 2015

(54) SUBSTRATE PROCESSING APPARATUS, SUBSTRATE PROCESSING METHOD, AND COMPUTER READABLE STORAGE MEDIUM STORING SUBSTRATE PROCESSING PROGRAM

(71) Applicant: Tokyo Electron Limited, Tokyo (JP)

(72) Inventors: Shuhei Matsumoto, Kumamoto (JP); Shuji Iwanaga, Kumamoto (JP); Hiroshi Tomita, Kumamoto (JP); Kenji Nakamizo, Kumamoto (JP); Satoshi Morita, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 117 days.

(21) Appl. No.: 13/677,534

(22) Filed: Nov. 15, 2012

(65) Prior Publication Data
US 2013/0334172 A1 Dec. 19, 2013

(30) Foreign Application Priority Data

Nov. 21, 2011 (JP) ................................. 2011-254087

(51) Int. Cl.
*C23F 1/00* (2006.01)
*H01L 21/67* (2006.01)
*G05D 3/00* (2006.01)
(52) U.S. Cl.
CPC ............ *H01L 21/67023* (2013.01); *G05D 3/00* (2013.01); *H01L 21/67051* (2013.01); *H01L 21/6708* (2013.01); *H01L 21/67259* (2013.01)

(58) Field of Classification Search
CPC .............. H01L 21/67023; H01L 21/67017; H01L 21/67063
USPC ............. 156/345.11, 345.13, 345.15, 345.24, 156/345.5; 118/712, 713; 382/144.145; 216/85, 86
See application file for complete search history.

(56) References Cited

U.S. PATENT DOCUMENTS

2010/0124610 A1* 5/2010 Aikawa et al. ........... 427/255.28
2010/0177953 A1* 7/2010 Hayashi et al. ................ 382/145
2012/0195490 A1* 8/2012 Langmans et al. ............ 382/149

FOREIGN PATENT DOCUMENTS

| JP | 2003-229403 A | 8/2003 |
|---|---|---|
| JP | 2008-066372 A | 3/2008 |
| JP | 2009-088184 A | 4/2009 |
| JP | 2010-087473 A | 4/2010 |

* cited by examiner

*Primary Examiner* — Lan Vinh
(74) *Attorney, Agent, or Firm* — Abelman, Frayne & Schwab

(57) ABSTRACT

Disclosed is a liquid processing apparatus capable of accurately determining a holding state of a substrate without being influenced by, for example, material or surface condition of a substrate. The liquid processing apparatus includes a substrate holding unit that holds a substrate, a camera that photographs a region where a peripheral edge portion of substrate is present when substrate is properly held by the substrate holding unit, and a control unit that determines a holding state of the substrate held by the substrate holding unit based on an image photographed by the camera.

10 Claims, 5 Drawing Sheets

SUBSTRATE PROCESSING APPARATUS, SUBSTRATE PROCESSING METHOD, AND COMPUTER READABLE STORAGE MEDIUM STORING SUBSTRATE PROCESSING PROGRAM

CROSS-REFERENCE TO RELATED APPLICATIONS

This application is based on and claims priority from Japanese Patent Application No. 2011-254087, filed on Nov. 21, 2011, with the Japanese Patent Office, the disclosure of which is incorporated herein in its entirety by reference.

TECHNICAL FIELD

The present disclosure relates to a substrate processing apparatus, a substrate processing method and a computer readable storage medium storing a substrate processing program.

BACKGROUND

When manufacturing, for example, a semiconductor device or a flat panel display, a substrate such as a semiconductor wafer or a liquid crystal substrate has been processed in the respective manufacturing processes using a substrate processing apparatus.

In the substrate processing apparatus, a substrate is transferred while being held by a substrate holding unit, or various processes are performed such as cleaning, etching or applying of a resist while rotating the substrate held by the substrate holding unit.

In the substrate processing apparatus of the related art, in order to detect whether a substrate is properly held by a substrate holding unit, laser light is irradiated from a light projecting device onto a surface of the substrate held in the substrate holding unit and an amount of light reflected from the surface of the substrate is detected by a light receiving device to determine whether the substrate is properly held by the substrate holding unit based on the detected amount of light. See, for example, Japanese Patent Application Laid-Open Publication No. 2003-229403.

However, in the substrate processing apparatus of the related art, even though the substrate is properly held by the substrate holding unit, the detected value by the light receiving device becomes lower when reflectivity of the substrate surface is low due to, for example, an influence by material or surface (reflecting surface) condition of a substrate.

Therefore, in the substrate processing apparatus of the related art, even though the substrate is properly held by the substrate holding unit, when the amount of light detected by the light receiving device is lower than the threshold value due to, for example, the influence by material or surface condition of a substrate, there is a concern for erroneous determination that the substrate is not properly held.

SUMMARY

An exemplary embodiment of the present disclosure provides a substrate processing apparatus which includes: a substrate holding unit configured to hold a substrate, a camera configured to photograph a region where a peripheral edge portion of the substrate is present when the substrate is properly held by the substrate holding unit, and a control unit configured to determine a holding state of the substrate held by the substrate holding unit based on an image photographed by the camera.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
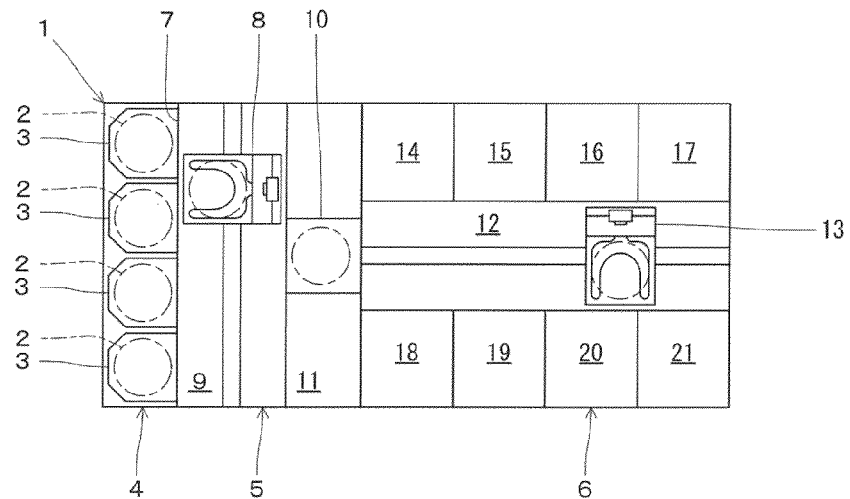
FIG. 1 is a plan view illustrating a substrate processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

A first exemplary embodiment of the present disclosure provides a substrate processing apparatus which includes: a substrate holding unit configured to hold a substrate, a camera configured to photograph a region where a peripheral edge portion of the substrate is present when the substrate is properly held by the substrate holding unit, and a control unit configured to determine a holding state of the substrate held by the substrate holding unit based on an image photographed by the camera.

In the substrate processing apparatus, the region to be photographed by the camera includes a substrate holding body installed on the substrate holding unit and holding the peripheral edge portion of the substrate.

Further, the camera photographs a region in which a plurality of the substrate holding bodies are included in a single photographing.

Moreover, the control unit determines the holding state of the substrate based on an area of the substrate holding body photographed by the camera.

Further, the control unit determines the substrate holding state based on a distance between the peripheral edge portion of the substrate and a cup installed around the substrate holding body.

Still further, the control unit determines the substrate holding state by comparing the distance between the peripheral edge portion of the substrate and the cup and a predetermined distance.

Still yet further, the control unit determines the substrate holding state by measuring the distance between the peripheral edge portions of the substrate and the cup at a plurality of sites and comparing the respective measurement values with one another.

A second exemplary embodiment of the present disclosure provides a substrate processing method which includes: holding a substrate, photographing a region where a peripheral edge portion of the substrate is present when the substrate is properly held, determining a holding state of the substrate based on an image photographed at the photographing, and processing the substrate when it is determined that the substrate holding state is normal.

In the substrate processing method, the photographing photographs a region in which a substrate holding body holding the peripheral edge portion of the substrate is included.

Further, a plurality of the substrate holding bodies are photographed in a single photographing.

In the substrate processing method, the substrate holding state is determined based on an area of the substrate holding body photographed at the photographing.

Further, the substrate holding state is determined based on a distance between the peripheral edge portion of the substrate and a cup installed around the substrate holding body.

Still further, the substrate holding state is determined by comparing the distance between the peripheral edge portion of the substrate and the cup and a predetermined distance.

Still yet further, the substrate holding state is determined by measuring the distance between the peripheral edge portions of the substrate and the cup at a plurality of sites and comparing the respective measurement values with each other.

A non-transitory computer-readable storage medium having stored a computer executable substrate processing program that, when executed, causes a computer to perform a substrate processing method which includes: photographing a region where a peripheral edge portion of the substrate is present by a camera when the substrate is properly held by a substrate holding unit, and determining a holding state of the substrate by a control unit based on an image photographed by the camera.

According to the present disclosure, it is possible to accurately determine a holding state of the substrate without being influenced by, for example, material or surface condition of a substrate.

Hereinafter, a substrate processing apparatus according to an exemplary embodiment of the present disclosure will be described with reference to the accompanying drawings.

As shown in FIG. 1, a substrate processing apparatus 1 includes a substrate carrying-in/out rack 4 provided at the front end portion thereof for collecting multiple sheets (for example, 25 sheets) of substrate 2 (a semiconductor wafer) and carrying-in/out with a carrier 3, a substrate transfer unit 5 provided at the rear part of substrate carrying-in/out rack 4 for transferring substrate 2 accommodated in carrier 3, and a substrate processing unit 6 provided at the rear part of substrate transfer unit 5 for cleaning or etching substrate 2.

In substrate carrying-in/out rack 4, four carriers 3 are disposed at a predetermined interval in a left and right direction while being closely adhered to a front wall 7 of substrate transfer unit 5.

In substrate transfer unit 5, a transfer chamber 9 accommodated with a substrate transfer apparatus 8 is formed at the front side thereof and a substrate delivery chamber 11 accommodated with a substrate transfer rack 10 is formed at the rear side thereof.

In substrate transfer unit 5, substrate 2 is transferred between any one of carriers 3 disposed on substrate carrying-in/out rack 4 and substrate transfer rack 10 using substrate transfer apparatus 8.

In substrate processing unit 6, a substrate transfer chamber 12 extending in forward and rearward is formed at the central part thereof and a substrate transfer apparatus 13 is accommodated within substrate transfer chamber 12.

In substrate processing unit 6, first to fourth substrate processing chambers 14, 15, 16 and 17 are disposed in parallel at one side of substrate transfer chamber 12, and fifth to eighth substrate processing chambers 18, 19, 20 and 21 are disposed in parallel at the other side of substrate transfer chamber 12.

In substrate processing unit 6, substrates 2 are transferred one by one between substrate delivery chamber 11 of substrate transfer unit 5 and the respective substrate processing chambers 14, 15, 16, 17, 18, 19, 20 and 21 while being held horizontally using substrate transfer apparatus 13 to be processed one by one in the respective substrate processing chambers 14, 15, 16, 17, 18, 19, 20 and 21.

Figure 2:
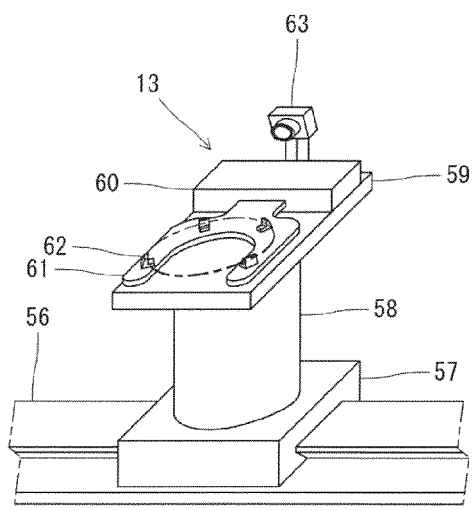
FIG. 2 is a perspective view illustrating a substrate transfer apparatus of the substrate processing apparatus.
Figure 3:
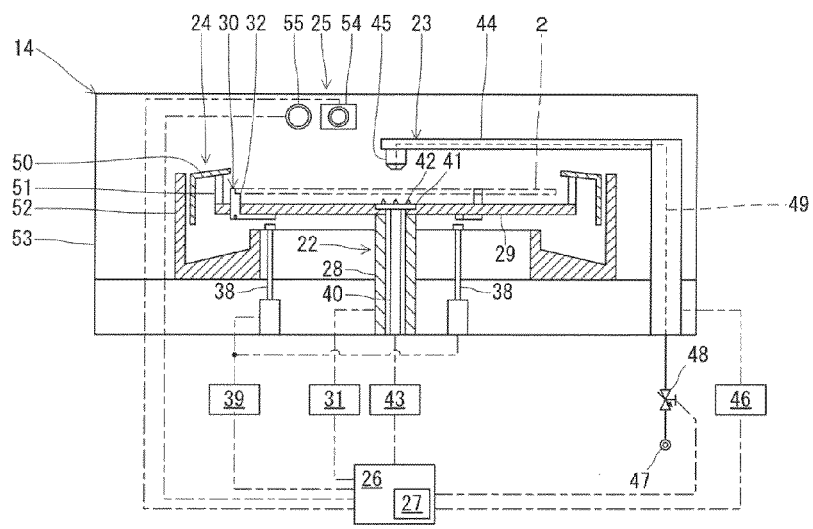
FIG. 3 is a front cross-sectional view illustrating a substrate processing chamber of the substrate processing apparatus.
Figure 4:
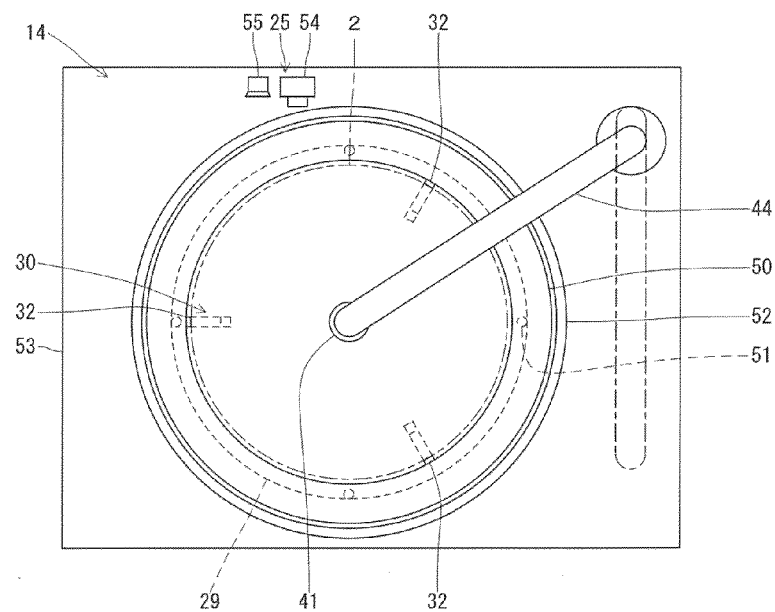
FIG. 4 is a plan view illustrating the substrate processing chamber of the substrate processing apparatus.

In substrate transfer apparatus 13, as illustrated in FIG. 2, a base 57 is movably mounted on a rail 56 constructed on a bottom part of substrate transfer chamber 12, a rotation mechanism 58 is attached to an upper part of base 57, and a table 59 is attached to an upper part of rotation mechanism 58. Further, in substrate transfer apparatus 13, an elevating mechanism 60 is attached to an upper part of a table 59, a substrate holding plate 61 formed in a fork shape is attached to elevating mechanism 60, and substrate holding bodies 62 for holding the substrate are attached to an upper surface of substrate holding plate 61 at a predetermined interval in a circumferential direction along an outer peripheral edge portion of substrate 2. In substrate transfer apparatus 13, a camera 63 serving as a photographing unit is attached to table 59 to be oriented towards substrate holding plate 61. Camera 63 is installed to be oriented towards a region where the peripheral edge portion of substrate 2 is present to photograph substrate 2 and substrate holding body 62. Camera 63 is connected to a control unit 26 to be described below to be driven and controlled by control unit 26. In the meantime, substrate transfer apparatus 8 installed in transfer chamber 9 has the same configuration as that of substrate transfer apparatus 13.

The respective substrate processing chambers 14, 15, 16, 17, 18, 19, 20 and 21 have the same configuration, and herein, a configuration of first substrate processing chamber 14 will be described as representative one.

Substrate processing chamber 14, as illustrated in FIG. 3 to FIG. 5C, includes a substrate holding unit 22 configured to rotate substrate 2 while holding substrate 2 horizontally, a processing liquid supply unit 23 configured to supply a processing liquid to the surface of substrate 2, a processing liquid recovery unit 24 configured to recover the processing liquid supplied to the surface of substrate 2, a photographing unit 25 configured to photograph a holding state of substrate 2, and control unit 26 configured to control substrate holding unit 22, processing liquid supply unit 23, processing liquid recovery unit 24 and photographing unit 25. Control unit 26 controls the respective operations of substrate processing apparatus 1 according to various programs stored in a storage medium 27.

In the substrate holding unit 2, a table 29 formed in a circular plate shape is attached to an upper end portion of a hollowed cylindrical a rotation shaft 28, and a substrate holding mechanism 30 is installed on table 29 for holding substrate 2 horizontally. A rotation driving mechanism 31 is connected to rotation shaft 28. Rotation driving mechanism 31 rotates rotation shaft 28 and table 29, and also rotates substrate 2 held on table 29 by substrate holding mechanism 30 horizontally. Rotation driving mechanism 31 is connected to control unit 26 and rotating thereof is controlled by control unit 26.

In substrate holding mechanism 30, a plurality of (e.g., three) substrate holding bodies 32 holding substrate 2 horizontally by holding the outer peripheral edge portion of substrate 2 are attached to a peripheral portion of table 29 at a predetermined interval in a circumferential direction. In substrate holding body 32, a base end portion of an arm portion 34 is attached to a bracket 33 formed on a lower surface of table 29 to be rotatable in upward and downward through a pivot axis 35, and a holding portion 37 penetrating through table 29 is formed on an upper part of the base end side of arm portion 34. A spring 36 that biases arm portion 34 downwardly is held between a lower surface of table 29 and an upper surface of arm portion 34. Further, in substrate holding mechanism 30, a driving rod 38 is disposed on lower part of a front end side of arm portion 34 at a predetermined interval. Driving rod 38 is connected with an elevating mechanism 39. Elevating mechanism 39 lifts and lowers driving rod 38, substrate holding body 32 is open and closed in association with lifting and lowering of driving rod 38, and a holding part 37 holds the outer peripheral edge portion of the substrate at the time of closing substrate holding body 32 to hold substrate 2. Elevating mechanism 39 is connected to control unit 26 and lifting and lowering thereof (opening and closing control of substrate holding body 32) is controlled by control unit 26.

In substrate holding unit 22, an elevating rod 40 for lifting and lowering substrate 2 is installed to be elevatable at a hollowed part of rotation shaft 28, an elevating rack 41 formed in a circular plate shape is installed at an upper end portion of elevating rod 40, and a latch pin 42 is attached to an upper surface of elevating rod 40. Elevating rod 40 is connected with an elevating mechanism 43. Elevating mechanism 43 lifts and lowers elevating rod 40 and elevating rack 41 to lift and lower substrate 2 engaged with the latch pin 42. Elevating mechanism 43 is connected to control unit 26, and controlled to be lifted or lowered by control unit 26.

In a processing liquid supply unit 23, an arm 44 is disposed at an upper side higher than table 29 to be movable horizontally and a nozzle 45 is attached to a front end portion of the arm 44. Arm 44 is connected with a moving mechanism 46. Moving mechanism 46 moves nozzle 45 between a retreat position located outside of substrate 2 and a supply starting position located at upper side of a central portion of substrate 2. Moving mechanism 46 is connected to control unit 26 and moving thereof is controlled by control unit 26.

Further, nozzle 45 of processing liquid supply unit 23 is connected to a processing liquid supply source 47 for supplying processing liquid (cleaning liquid, rinsing liquid, or etching liquid) through a flow rate adjuster 48 and a supply flow path 49. The flow rate adjuster 48 adjusts the flow rate of the processing liquid to be supplied to nozzle 45. Flow rate adjuster 48 is connected to control unit 26 and opening/closing and flowing rate thereof are controlled by control unit 26.

In processing liquid recovery unit 24, a cover 50 formed in a ring shape is attached to the upper part of table 29 through a post 51, and a cup 52 being open toward an upper side and connected to a liquid discharge pipe (not illustrated) is disposed around table 29. Processing liquid recovery unit 24 surrounds substrate 2 disposed on table 29 with the cover 50 and cup 52 to prevent scattering of the processing liquid and recover processing liquid.

In photographing unit 25, a camera 54 and a light 55 is attached to a casing 53 of substrate processing chamber 14 to be oriented towards table 29. Camera 54 and light 55 are arranged to be oriented towards a region where the peripheral edge portion of substrate 2 is present while substrate 2 is held to be stopped in substrate holding unit 22 to photograph substrate 2 and substrate holding body 32. Camera 54 and light 55 are connected to and driven by control unit 26. Depending on the contrast of the region to be photographed by camera 54, light 55 may be removed or multiple lights 54 may be installed. Light 55 is installed at a position where an unwanted shadow is not generated when photographing. Light 54 may include one which irradiates an infrared light and camera 54 may include one equipped with a visible light blocking filter. It is possible to photograph without depending on the brightness in and out of an apparatus by blocking visible light other than infrared light in camera 54 while irradiating infrared light from light 55.

Substrate processing apparatus 1 is configured as described above, and processes substrate 2 in the respective substrate processing chambers 14, 15, 16, 17, 18, 19, 20 and 21 according to a substrate processing program stored in a storage medium 27 readable by control unit 26 (e.g., computer). In the meantime, storage medium 27 includes one which can store various programs, such as a substrate processing program, and may be a semiconductor memory type storage medium, such as ROM or RAM, or a disk shaped storage medium, such as a hard disk or CD-ROM.

Figure 6:
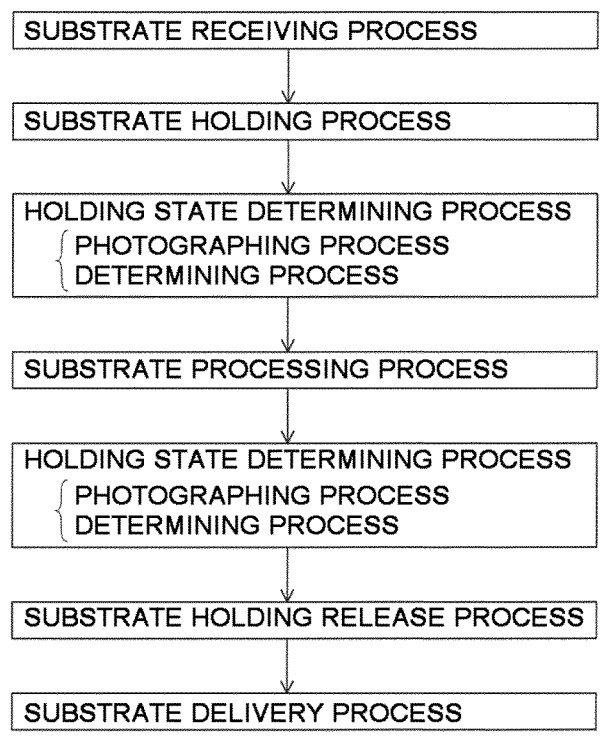
FIG. 6 is a flow chart illustrating a substrate processing program according to the exemplary embodiment of the present disclosure.

Substrate 2 is processed in substrate processing apparatus 1 according to the substrate processing program illustrated in FIG. 6. In the meantime, in the following description, a processing of substrate 2 performed in substrate processing chamber 14 will be described as representative one, but substrate 2 may be processed in the other substrate processing chambers 15, 16, 17, 18, 19, 20 and 21 in the same manner as in substrate processing chamber 14.

First, the substrate processing program is executed to perform a substrate receiving process in which substrate 2 carried-in by substrate transfer apparatus 13 is received by substrate holding unit 22 in substrate processing chamber 14.

In the substrate receiving process executed by the substrate processing program, elevating mechanism 43 of substrate holding unit 22 is controlled by control unit 26 to lift elevating rod 40 and elevating rack 41 upward to a position higher than table 29 to cause latch pin 42 to receive substrate 2 from substrate transfer apparatus 13.

Figure 5A:
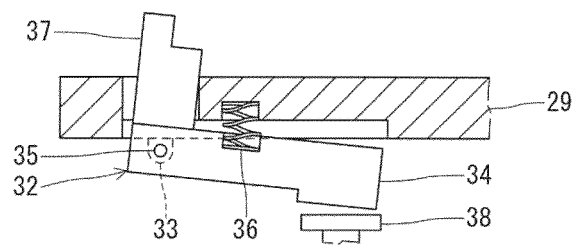
FIGS. 5A to 5C are explanatory views illustrating the operation of a substrate holding unit of the substrate processing apparatus.

When substrate 2 is carried into substrate processing chamber 14, as illustrated in FIG. 5A, driving rod 38 is located in a lowered position and substrate holding body 32 is closed due to a biasing force of spring 36. When elevating rod 40 and elevating rack 41 are lifted according to the execution of the substrate processing program, as illustrated in FIG. 5B, elevating mechanism 39 of substrate holding mechanism 30 is controlled by control unit 26 to lift driving rod 38 to a predetermined position to cause substrate holding body 32 to be opened against the biasing force of spring 36.

Thereafter, the substrate processing program is executed to control elevating mechanism 43 of substrate holding unit 22 to lower elevating rod 40 and elevating rack 41 to dispose substrate 2 at an upper part of substrate holding mechanism 30.

Figure 5B:
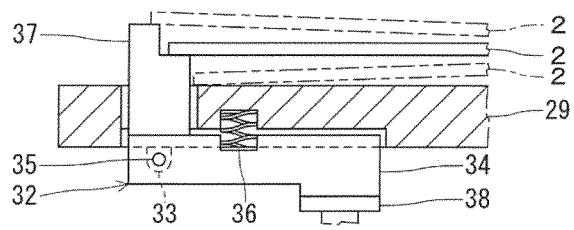

Here, when the position of substrate 2 falls within a predetermined range, substrate 2 is properly disposed at the predetermined position of holding part 37 of substrate holding body 32 as depicted by the solid line in FIG. 5B. In the meantime, when the position of substrate 2 falls out of a predetermined range, substrate 2 is disposed at an upper part of holding part 37 of substrate holding body 32 as depicted by the alternated long and short dash line in FIG. 5B, otherwise, fallen off holding part 37 of substrate holding body 32 downward as depicted by the alternated long and two short dashes line in FIG. 5B.

Subsequently, the substrate processing program is executed to perform a substrate holding process in which substrate 2 is held by substrate holding mechanism 30.

Figure 5C:
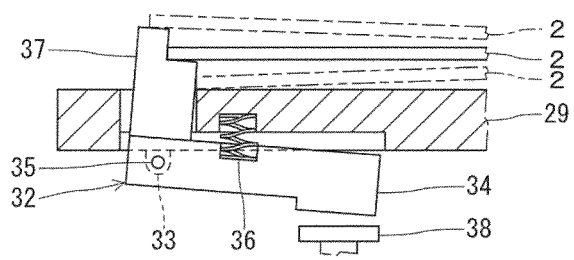

In the substrate holding process executed by the substrate processing program, elevating mechanism 39 of substrate holding mechanism 30 is controlled by control unit 26 to lower driving rod 38 to cause substrate holding body 32 to be closed by the biasing force of spring 36 as illustrated in FIG. 5C.

In this case, when substrate 2 was disposed at the predetermine position of holding part 37 of substrate holding body 32 at the previous substrate receiving process, the peripheral edge portion of the substrate is held favorably by holding part 37 of substrate holding body 32 to be properly held as depicted by the solid line in FIG. 5C. In the meantime, when substrate 2 was disposed at the upper part of holding part 37 of substrate holding body 32 in the substrate receiving process, the peripheral edge portion of substrate 2 is put on the upper part of holding part 37 of substrate holding body 32 as depicted by the alternated long and short dash line in FIG. 5C. When substrate 2 was fallen off downward, substrate 2 is fallen off of holding part 37 of substrate holding body 32 as depicted by the alternated long and two short dashes line in FIG. 5C. That is, substrate 2 is not properly held.

Subsequently, the substrate processing program is executed to perform a substrate holding state determination process that determines a holding state of substrate 2.

In the substrate holding state determination executed by the substrate processing program, a photographing unit 25 is controlled by control unit 26 to turn ON light 55 and to make camera 54 to photograph the predetermined region, and then turn OFF light 55 (photographing process).

In this case, in substrate processing apparatus 1, a region where the peripheral edge portion of substrate 2 is present when substrate 2 is properly held by substrate holding unit 22 (a state depicted by solid line in FIG. 5C) is photographed.

Thereafter, the substrate processing program is executed to determine a holding state of substrate 2 based on an image photographed by camera 54 (determination process). The holding state of substrate 2 is determined by comparing an image in which an actual holding state of substrate 2 is photographed by camera 54 and a reference image. The reference image is, for example, an image in which a substrate being held properly is photographed in advance. A coincidence ratio of these images is calculated, and when the coincidence ratio is equal to or more than a predetermine value, it is determined that substrate 2 is properly held, and when the coincidence ratio is less than the predetermine value, it is determined that substrate 2 is not properly held.

Thereafter, when it is determined that substrate 2 is properly held, the substrate processing program is executed to perform the substrate processing process, and when it is determined that substrate 2 is not properly held, the substrate processing program is executed such that the processing of substrate 2 is temporarily stopped and an error occurrence is notified to an operator. In the meantime, when the occurred error is settled by the operator, the substrate holding state determination process is performed again by the substrate processing program.

In the substrate processing process executed by the substrate processing program, substrate holding unit 22 or substrate processing liquid supply unit 23 is appropriately controlled by control unit 26 to process substrate 2.

After the substrate processing process, the substrate holding state determination process is performed again according to the execution of the substrate processing program. When it is determined that substrate 2 is properly held, the substrate processing program is executed to sequentially perform a substrate holding release process which is contrary to the substrate holding process and a substrate delivery process which is contrary to the substrate receiving process to deliver substrate 2 to substrate transfer apparatus 13. In the meantime, when it is determined that substrate 2 is not properly held, the processing of substrate 2 is temporarily stopped and an error occurrence is notified to an operator, and thereafter, when the error is resolved, the substrate holding state determination process is performed again.

As described above, in substrate processing apparatus 1, the region where the peripheral edge portion of the substrate is present when substrate 2 is properly held is photographed and the holding state of substrate 2 is determined based on an image photographed.

Therefore, in substrate processing apparatus 1, since the holding state of substrate 2 can be determined without being influenced by material or a surface condition of substrate 2, it is possible to accurately determine the holding state of substrate 2.

An area to be photographed may include one in which at least the peripheral edge portion of substrate 2 can be photographed in a state where substrate 2 is properly held, or other members than substrate 2 such as, substrate holding body 32, cover 50, a post 51 or cup 52, present in the peripheral edge portion of the substrate can be photographed as well in a state where substrate 2 is properly held. When substrate 2 together with substrate holding body 32 is photographed, the holding state of substrate 2 held by substrate holding body 32 can be detected in high precision.

Further, the photographing method may include one that can photograph at least one sheet of image, or a plurality of sheets of image can be photographed. For example, when the plurality of sheets of image of substrate 2 held in substrate holding body 32 are photographed, substrate 2 and one or two substrate holding bodies 32 are photographed and then, substrate 2 is rotated to photograph substrate 2 and the remaining substrate holding bodies 32 such that a different multiple sheets of images may be photographed. By doing this, a photographing can be performed with only one camera 54 to simplify the configuration of the apparatus. Further, all substrate holding bodies 32 may be photographed concurrently using a plurality of the cameras 54. In this manner, all the substrate holding bodies 32 can be photographed at once, so that a time required for the photographing process can be reduced to improve throughput. Still further, a plurality of images may be photographed in different angles by changing the photographing direction of camera 54 using camera 54 movably mounted to casing 53. By doing this, moving camera 54 causes a smaller amount of camera movement as compared with a case where substrate holding body 32 is sequentially photographed by rotating substrate 2, so that it is possible to photograph all the substrate holding bodies 32 in a short time. Accordingly, the time required for the photographing process can be reduced to improve throughput. Substrate holding body 32 may be photographed in a larger image using camera 54 having a zoom function. Substrate holding body 32 can be photographed in a larger image to determine the holding state of substrate 2 more easily.

Further, a line sensor camera may be used as camera 54 and fixed to casing 53 to rotate substrate 2 one revolution in substrate holding unit 22 to photograph the peripheral edge portion of the substrate. When the line sensor camera is used, substrate 2 is rotated to continually photograph the peripheral edge portion of the substrate. Therefore, since an image amounts to one revolution can be photographed irrespective of photographing starting site, it is possible to photograph without being limited to a position of substrate holding body 32, thereby simplifying the control of photographing unit 25 or substrate holding unit 22.

Figure 7A:
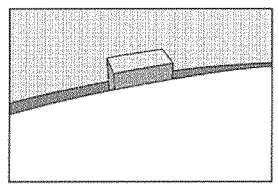
FIGS. 7A to 7D are views illustrating an image having been photographed.

The holding state determination method may be adopted as long as the holding state of substrate is determined based on the photographed image and does not limited to a case where the holding state is determined by a comparison with the reference image. For example, an area of a particular member, such as substrate 2 or substrate holding unit 22 may be acquired and compared with a predetermined area to determine the holding state of substrate 2. For example, the area of substrate holding unit 22 is acquired from an image where substrate 2 and a portion of substrate holding unit 22 as illustrated in FIG. 7A are photographed. In this case, when substrate 2 is properly held in substrate holding body 32, the acquired area of substrate holding body 32 falls within the predetermined area, so that it is determined that substrate 2 is properly held in substrate holding body 32. In contrast, when the acquired area falls out of the predetermined area, it is determined that substrate 2 is not properly held in substrate holding body 32.

Further, the distance between substrate 2 and the particular members other than substrate 2, such as substrate holding body 32, the cover 50, the post 51, or cup 52 and the like may be measured to determine the held state of substrate 2 based on the measured distance. For example, when the measured distance on the image is compared with a predetermined distance, if a distance measured on the image is shorter than the predetermined distance, it can be determined that substrate 2 is put on substrate holding body 32 and otherwise, if a distance measured on the image is longer than the predetermined distance, substrate 2 is fallen off substrate holding body 32. The distance between substrate 2 and the particular members may be measured at a plurality of site to compare the respective measurements with each other, such that the holding state of substrate 2 may be determined.

Figure 7B:
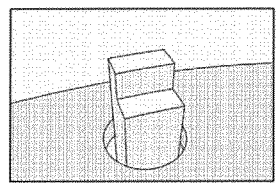
Figure 7C:
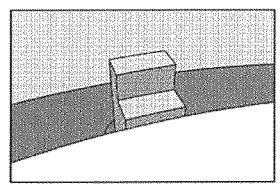
Figure 7D:
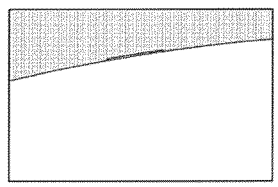

The determined contents of the holding state of the substrate may be acceptable as long as the matter on whether substrate 2 is properly held or not can be determined from the determined contents. When substrate 2 is not properly held in substrate holding body 32, the determination on the holding states of substrate 2 may be subdivided into cases where substrate 2 is not present, where substrate 2 is put on substrate holding body 32, or substrate 2 is fallen off downwardly from substrate holding body 32. When substrate 2 is properly held in substrate holding body 32, an image in which substrate 2 and the portion of substrate holding body 32 is photographed is generated as illustrated in FIG. 7A. In contrast, when substrate 2 is not present in substrate holding body 32, an image in which substrate holding body 32 is not covered by substrate 2 and substrate holding body 32 is photographed to be much larger than a case where substrate 2 is properly held in substrate holding body 32 is generated, as illustrated in FIG. 7B. Further, when substrate 2 is fallen off downwardly from substrate holding body 32, an image in which only the lower portion of substrate holding body 32 is covered by substrate 2 and substrate holding body 32 is photographed to be larger than a case where substrate 2 is properly held in substrate holding body 32 is generated, as illustrated in FIG. 7C. Still further, when substrate 2 is put on substrate holding body 32, an image in which the upper portion of substrate holding body 32 is also covered by substrate 2 and substrate holding body 32 is photographed to be smaller than a case where substrate 2 is properly held in substrate holding body 32 is generated, as illustrated in FIG. 7D. Accordingly, when the area of substrate holding body 32 is acquired, if the size of the acquired area is equal to or larger than a first threshold value, it is determined that substrate 2 is not present, and otherwise if the size of the acquired area is less than the first threshold value and equal to or larger than a second threshold value, it is determined that substrate 2 is fallen off downwardly from substrate holding body 32. When the size of the acquired area is less than the second threshold value and equal to or larger than a third threshold value, it is determined that substrate 2 is properly held in substrate holding body 32, and otherwise if the size of the acquired area is less than the third threshold value, it is determined that substrate 2 is put on substrate holding body 32. Even when substrate holding body 32 is differently photographed depending on, for example, the angle of camera 54, the threshold values are set for each substrate holding body 32 such that it is possible to accurately determine the holding state of substrate 2. As described above, the erroneous holding states of substrate 2 is subdivided in detail, so that an operator can smoothly resolve the erroneous holding states. In the meantime, when the entirety of substrate holding body 32 is photographed even when substrate 2 is carried into substrate processing chamber 14, it may be determined that substrate 2 is in a broken state.

In the above-described description, the present disclosure is described regarding an embodiment where the substrate holding apparatus is utilized in holding substrate 2 in substrate processing chambers 14, 15, 16, 17, 18, 19, 20 and 21. However, the present disclosure may also be applied to a substrate holding apparatus used in holding substrate 2 in substrate transfer apparatus 13 of the substrate transfer chamber 12, or substrate transfer apparatus 8 in substrate transfer chamber 9 of substrate processing apparatus 1. Also, the present disclosure may be applied to a substrate transfer apparatus that transfers substrate 2 independently. In this case, a substrate transfer apparatus may be equipped with a photographing unit or the photographing unit may be installed at a predetermined photographing site within the substrate processing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus for processing a substrate comprising:
a substrate holding unit configured to hold a substrate;
a processing liquid supply unit connected to a processing liquid supply source and configured to supply a processing liquid to the substrate;
a camera configured to photograph a region where a peripheral edge portion of the substrate is present when the substrate is properly held by the substrate holding unit; and
a control unit configured to determine whether the substrate is properly held by the substrate holding unit by comparing an image of an actual holding state of the substrate photographed by the camera with a reference image prepared in advance representing a normal holding state of the substrate in which the substrate is properly held by the substrate holding unit, wherein the control unit is further configured to calculate a coincidence ratio between the photographed image and the reference image, determine that the substrate is properly held by the substrate holding unit when the coincidence ratio is equal to or more than a predetermined value, and determine that the substrate is not properly held by the substrate holding unit when the coincidence ratio is less than the predetermined value.

2. The liquid processing apparatus of claim 1, wherein the region to be photographed by the camera includes both the substrate and a substrate holding body installed on the substrate holding unit to actually hold the peripheral edge portion of the substrate, thereby improving the precision of the comparing.

3. The apparatus of claim 1, wherein, when it is determined that the substrate is held properly, the control unit is further configured to execute a substrate processing program to perform a liquid processing for the substrate and, when it is determined that the substrate is not held properly, the control unit is further configured to notify with an operator an error occurrence.

4. The apparatus of claim 1, further comprising a spring configured to apply a biasing force against the substrate holding unit such that the substrate holding unit is in an open state to hold the substrate.

5. An apparatus for processing a substrate comprising:
a substrate holding unit including a substrate holding body configured to hold a substrate;
a processing liquid supply unit connected to a processing liquid supply source and configured to supply a processing liquid to the substrate;
a camera configured to photograph a region where a peripheral edge portion of the substrate is present when the substrate is properly held by the substrate holding unit;
a control unit configured to determine whether the substrate is properly held by the substrate holding unit by comparing an area of the substrate holding body in the image photographed by the camera with a reference area obtained in advance representing a normal holding state of the substrate in which the substrate is properly held by the substrate holding unit; and
a spring configured to a biasing force against the substrate holding unit such that the substrate holding unit is in an open state to hold the substrate.

6. An apparatus for processing a substrate comprising:
a substrate holding unit configured to hold a substrate;
a processing liquid supply unit connected to a processing liquid supply source and configured to supply a processing liquid to the substrate;
a camera configured to photograph a region where a peripheral edge portion of the substrate is present when the substrate is properly held by the substrate holding unit;
a control unit configured to determine whether the substrate is properly held by the substrate holding unit by comparing a distance between the peripheral edge portion of the substrate and a cup installed around the substrate holding body in the image photographed by the camera with a distance obtained in advance representing a normal state of the substrate in which the substrate is properly held by the substrate holding unit; and
a spring configured to apply a biasing force a against the substrate holding unit such that the substrate holding unit is in an open state to hold the substrate.

7. The liquid processing apparatus of claim 6, wherein the control unit determines the holding state of the substrate by comparing the distance between the peripheral edge portion of the substrate and the cup and a predetermined distance.

8. The liquid processing apparatus of claim 6, wherein the control unit determines the holding state of the substrate by measuring the distance between the peripheral edge portions of the substrate and the cup at a plurality of sites and comparing the respective measurement values with one another.

9. An apparatus for processing a substrate comprising:
a substrate holding unit configured to hold a substrate;
a processing liquid supply unit connected to a processing liquid supply source and configured to supply a processing liquid to the substrate;
a camera configured to photograph a region where a peripheral edge portion of the substrate is present when the substrate is properly held by the substrate holding unit;
a control unit configured to determine whether the substrate is properly held by the substrate holding unit by comparing an image of an actual holding state of the substrate photographed by the camera with a reference image prepared in advance representing a normal holding state of the substrate in which the substrate is properly held by the substrate holding unit; and
a spring configured to apply a biasing force against the substrate holding unit such that the substrate holding unit is in an open state to hold the substrate.

10. The apparatus of claim 9, wherein the substrate holding unit includes a plurality of substrate holding bodies disposed at a predetermined interval in a circumferential direction holding outer peripheral edge portion of the substrate, the camera is configured to photograph the plurality of substrate holding bodies, and, when it is determined that the substrate is not properly held, the control unit is further configured to determine whether the substrate is not present, the substrate is put on the substrate holding body, or the substrate is fallen off downwardly from the substrate holding body.

* * * * *